United States Patent
Sakakibara

(10) Patent No.: US 6,670,673 B2
(45) Date of Patent: Dec. 30, 2003

(54) SEMICONDUCTOR DEVICE AND METHOD FOR MANUFACTURING SEMICONDUCTOR DEVICE

(75) Inventor: Jun Sakakibara, Anjo (JP)

(73) Assignee: Denso Corporation, Kariya (JP)

( * ) Notice: Subject to any disclaimer, the term of this patent is extended or adjusted under 35 U.S.C. 154(b) by 1 day.

(21) Appl. No.: 10/118,930

(22) Filed: Apr. 10, 2002

(65) Prior Publication Data

US 2002/0155685 A1 Oct. 24, 2002

(30) Foreign Application Priority Data

Apr. 18, 2001 (JP) ........................ 2001-120163

(51) Int. Cl.[7] .............................................. H01L 29/76
(52) U.S. Cl. ........................ 257/328; 257/341
(58) Field of Search ..................... 257/107, 328, 257/329, 335, 336, 341, 491, 492

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 5,723,891 A | * 3/1998 | Malhi | ........................ 257/341 |
| 5,828,101 A | 10/1998 | Endo | |
| 6,281,547 B1 | 8/2001 | So et al. | |

FOREIGN PATENT DOCUMENTS

| | | |
|---|---|---|
| JP | A-61-125174 | 6/1986 |
| JP | A-63-66963 | 3/1988 |
| JP | A-64-9662 | 1/1989 |
| JP | A-3-283669 | 12/1991 |
| JP | A-4-162572 | 6/1992 |
| JP | A-5-82782 | 4/1993 |
| JP | A-8-204195 | 8/1996 |
| JP | A-10-214969 | 8/1998 |
| JP | A-11-103058 | 4/1999 |
| JP | A-11-150265 | 6/1999 |

OTHER PUBLICATIONS

U.S. patent application Ser. No. 09/688,154, Yamaguchi et al., filed Oct. 16, 2000.

* cited by examiner

Primary Examiner—Craig Thompson
(74) Attorney, Agent, or Firm—Rosz & Bethards, PLC

(57) ABSTRACT

A first trench is formed in a surface of an $n^+$-type semiconductor substrate that forms a source region. A p-type base region, an $n^-$-type drift region, and an $n^+$-type drain region are deposited in this order in the first trench using epitaxial growth. A second trench extending from the source region to the drift region through the base region is formed in the surface. A gate insulating film and a gate electrode are formed on a surface defining the second trench. The $n^+$-type drain region has a location where growing surfaces come together in epitaxial growth and where a defect is likely to occur, and the gate electrode lacks such a location and thus avoids an increase in normalized ON resistance. Therefore, the breakdown voltage remains high without increasing the ON resistance.

11 Claims, 11 Drawing Sheets

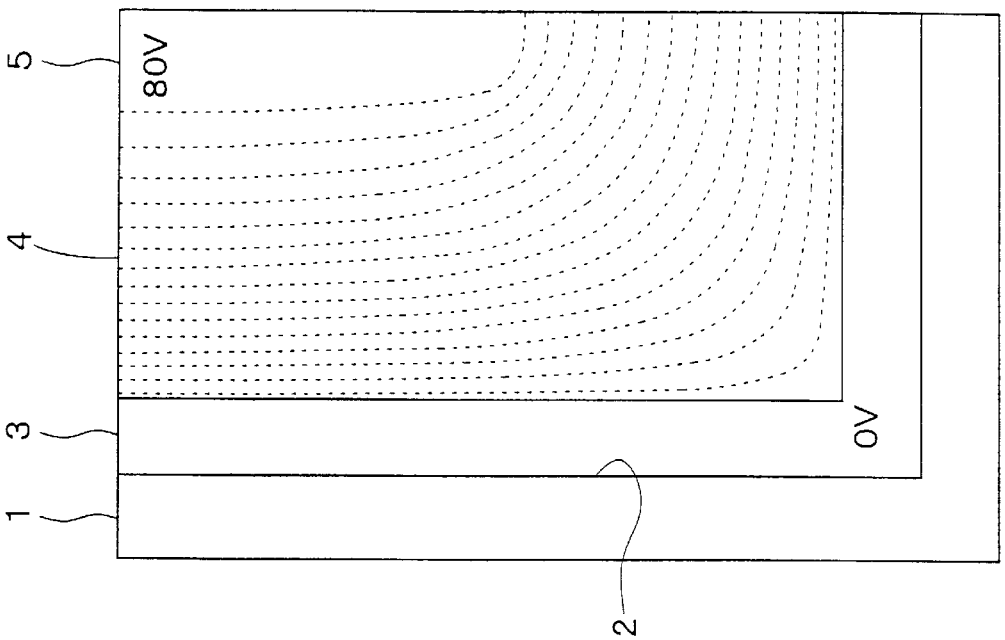

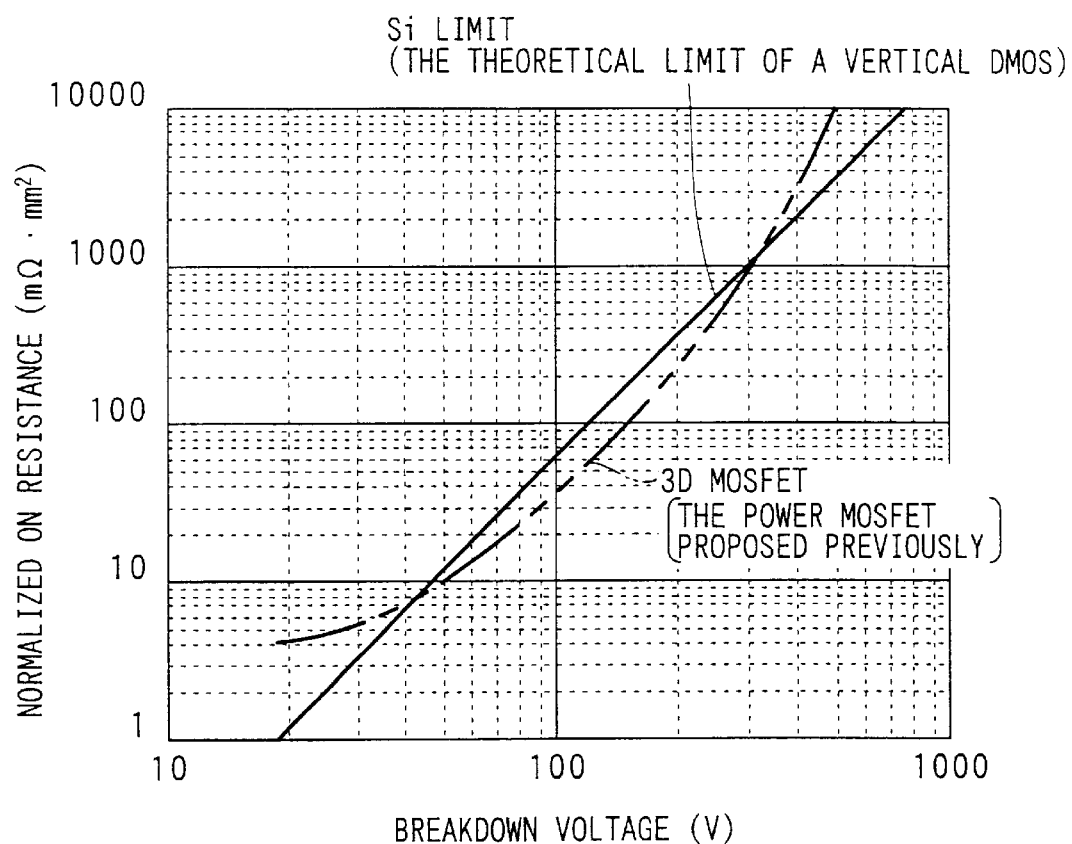

US 6,670,673 B2

SEMICONDUCTOR DEVICE AND METHOD FOR MANUFACTURING SEMICONDUCTOR DEVICE

CROSS REFERENCE TO RELATED APPLICATION

This application is based on and incorporates herein by reference Japanese Patent Application No. 2001-120163 filed on Apr. 18, 2001.

BACKGROUND OF THE INVENTION

The present invention relates to a semiconductor device having an insulated gate. The present invention is applicable to a power MOSFET (Metal-Oxide-Silicon Field Effect Transistor), an IGBT (Insulated Gate Bipolar Transistor), or a thyristor.

A power MOSFET having low ON-resistance was previously proposed by the present inventor. As shown in FIG. 14, the power MOSFET is has an $n^+$-type substrate J1 making up an $n^+$-type drain region and, an $n^-$-type drift region J5, a p-type base layer J4, an $n^+$-type source layer J3, and a plurality of gate electrodes J2. The gate electrodes J2 are plate-like and are embedded upright in the power MOSFET to divide the p-type base layer J4 and the $n^+$-type source layer J3 into a plurality of p-type base regions J4 and a plurality of $n^+$-type source regions J3, respectively. With this structure, channels are formed to extend in the lateral direction of FIG. 14.

The power MOSFET shows especially low ON resistance in the range between low and medium breakdown voltage. For example, when each gate electrode J2 has a depth of 30 micrometers, the power MOSFET has a correlation shown in FIG. 15 between normalized ON resistance and breakdown voltage. The power MOSFET has a lower normalized ON resistance than the theoretical limit of a vertical DMOS (double-diffused MOS) in the breakdown voltage range between about 40 and 300 V.

The power MOSFET described above is manufactured in the manner shown in FIGS. 16A to 16E. As shown in FIG. 16A, a silicon oxide film J6 formed on a surface of the substrate J1 is defined using photolithography. The substrate J1, when masked by the defined film J6, is etched to form a trench J7, as shown in FIG. 16B. The trench J7 is filled with the $n^-$-type drift region J5, the p-type base layer J4, and the $n^+$-type source layer J3 in this order using an epitaxial growth technique, as shown in FIGS. 16C and 16D. Afterward, the three layers above the level of the silicon oxide film J6 are removed. Although not illustrated, the power MOSFET is completed with the following steps or steps similar to the following steps. A plurality of trenches are formed to divide the p-type base layer J4 and the $n^+$-type source layer J3 into a plurality of $n^+$-type source regions J3 and a plurality of p-type base regions J4, respectively. A gate oxide layer is formed on the surface defining each trench. Then, each trench is filled with the gate electrode J2.

After the trench J7 is filled with the layer J3, a crystalline defect or void tends to occur in the trench J7 because the surface of the layer J3 grows inwardly from the sidewall of the trench J7 and joins, or meets itself, in the trench J7. If the crystalline defect or void is generated in the proximity of the gate oxide layer, the breakdown voltage of the gate is reduced. FIG. 17 shows a structural modification, in which each gate electrode J2 is divided in two and the $n^+$-type source layer J3 is widened. This modification prevents the breakdown voltage from being reduced by the crystalline defect. However, this modification enlarges the size of the device and decreases the area of the channel. The normalized ON resistance increases due to the decreased area of the channel.

In addition, the p-type base layer J4 is formed in the lightly-doped $n^-$-type drift region J5 in the proposed power MOSFET, so the electric field is unfavorably concentrated at the bottom corner of the layer J4, as shown in FIG. 18, which is a simulation of electric field distribution when 80 V is applied to the drain.

SUMMARY OF THE INVENTION

The present invention has been made in view of the above problems with an object to prevent the breakdown voltage from being reduced without increasing the ON resistance and with another object to suppress the electric field concentration at the bottom corner of the layer J4.

In the present invention, a power MOSFET is fabricated from an $n^+$-type substrate having a top surface and a back surface, which is opposite to the top surface. A first trench is formed in the substrate at a predetermined depth from the top surface. A p-type base region is formed in the first trench. An $n^-$-type drift region is formed in the p-type base region. An $n^+$-type drain region is formed in the $n^-$-type drift region. A second trenche is formed to pass through the p-type base region in a lateral direction. A gate insulating film is formed on a surface defining the second trench. A gate electrode is formed on each gate insulating film to fill the second trench.

The $n^+$-type drain region has a location where opposed parts of an epitaxial growth layer meet, thus the gate electrode does not need to be positioned to avoid this location. Therefore, the breakdown voltage is maintained without increasing the ON resistance. In addition, the $n^-$-type drift region is formed in the p-type base region, so the electric field concentration at the bottom corner of the p-type base region is reduced.

BRIEF DESCRIPTION OF THE SEVERAL VIEWS OF THE DRAWING

The above and other objects, features and advantages of the present invention will become more apparent from the following detailed description made with reference to the accompanying drawings. In the drawings:

FIG. 1 is a perspective cross-sectional view of a power MOSFET according to the first embodiment of the present invention;

FIG. 2 is a cross-sectional view of the power MOSFET according to the first embodiment showing the simulated electric field distribution;

FIG. 15 is a graph showing the correlation between normalized ON resistance and breakdown voltage;

DETAILED DESCRIPTION OF THE PREFERRED EMBODIMENTS

Figure 3A:
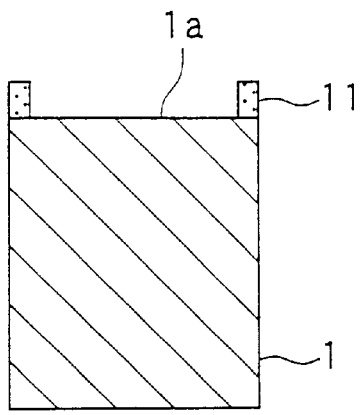
FIGS. 3A to 3E are cross-sectional views of the power MOSFET in FIG. 1 showing fabrication steps, respectively, in order of their performance.

The present invention will be described in detail with reference to various embodiments, in which the same reference numerals designate same or similar parts.

First Embodiment

The structure of a power MOSFET in a first embodiment of the present invention will be described with reference to FIG. 1. In FIG. 1, the power MOSFET is fabricated from an n$^+$-type substrate 1 having a top surface 1a, or main surface, and a back surface 1b, which is opposite to the top surface 1a. The substrate 1 forms an n$^+$-type (first conduction type) source region that is homogeneously doped with any of phosphorus (P), arsenic (As), and antimony (Sb), which are n-type impurities, with a concentration ranging between $1\times10^{18}$ and $1\times10^{20}$ cm$^{-3}$. A trench 2 (first trench) is formed in the substrate 1 with a predetermined depth from the top surface 1a. The depth ranges, for example, between 1 and 100 micrometers. A p-type (second conduction type) base region 3 having a thickness ranging between 0.1 and 5 micrometers is formed in the trench 2. The base region 3 is homogeneously doped with B (boron), which is a p-type impurity, with a concentration ranging between $1\times10^{15}$ and $1\times10^{18}$ cm$^{-3}$. An n$^-$-type (first conduction type) drift region 4, which has a predetermined thickness for determining a desired breakdown voltage, is formed in the base region 3. The drift region 4 is homogeneously doped with phosphorous or arsenic at a concentration ranging between $1\times10^{14}$ and $1\times10^{17}$ cm$^{-3}$. An n$^+$-type (first conduction type) drain region 5, the width of which ranges between 0.1 and 5 micrometers, is formed in the drift region 4. The drain region 5 is homogeneously doped with phosphorous or arsenic at a concentration ranging between $1\times10^{18}$ and $1\times10^{20}$ cm$^{-3}$.

A plurality of trenches 6 (second trenches), which are substantially perpendicular to the top surface 1a, are formed to penetrate the p-type base region 3, as shown. A gate oxide film 7 (gate insulating film) is formed on the surface that defines each trench 6. A gate electrode 8 is formed in the gate oxide film 7 to fill each trench 6.

In this structure, the n$^+$-type source region, the p-type base region 3, the n$^-$-type drift region 4, and the n$^+$-type drain region 5 are layered in this order in a lateral direction as shown. The lateral layering occurs from the main surface 1a to approximately the depth level of the trench 6. The depths of the base region 3, the drift region 4, and drain region 5 are determined in response to the depth of the trenches 6, so the deeper the trenches 6 are, the deeper the base region 3, the drift region 4, and drain region 5 are. Although not illustrated in FIG. 1, another oxide film is formed on the top surface 1a of the substrate 1. The gate electrode 8 is defined on the oxide film. Although not illustrated in FIG. 1, a drain electrode is formed on an interlayer insulating film covering the gate electrode 8.

When positive voltage is applied to the gate 8, electrons are drawn toward the gate oxide film 7 in the vicinity of the surface of the base region 3 adjacent to each trench 6, and a channel region, which is an inverted region of the p-type base region 3, is formed. The lateral dimension of the channel region extends in the vertical direction of FIG. 1. That is, the channel region extends in the lateral direction of FIG. 1. A drain current is conducted between the substrate 1 and the drift region 4 in a direction parallel to the substrate surface 1a. The width, or lateral dimension, of the channel region is approximately equal to the depth of the trenches 6, because the n$^+$-type source region and the base region 3, the drift region 4, and the drain region 5 are layered in this order from the surface 1a to substantially the depth level of the trenches 6. Therefore, the channel resistance is reduced by deepening the trenches 6 without enlarging the area of each unit cell. Thus the ON resistance of the power MOSFET is lower.

In this power MOSFET, the n$^-$-type drift region 4 is formed in the p-type base region 3, so the electric field concentration at the bottom corner of the base region 3 is reduced, as shown by the simulated electric field distribution in FIG. 2. The simulation is done with the assumptions that the base region 3 is doped with boron with a concentration of $1\times10^{17}$ cm$^{-3}$, the region 4 is doped with phosphorous with a concentration of $1\times10^{15}$ cm$^{-3}$, and that 80 V is applied to the drain D.

Figure 3B:
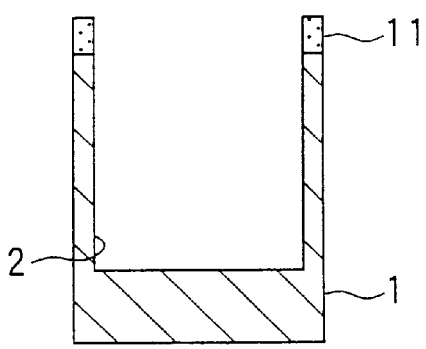

The method for fabricating the power MOSFET according to the first embodiment will be described in detail with reference to FIGS. 3A to 3E. As shown in FIG. 3A, a silicon oxide film 11 is formed on the top surface 1a of the substrate 1 by thermal oxidation or CVD (chemical vapor deposition). A predetermined area of the film 11, where the trench 2 is formed, is opened using photolithography, as shown in FIG. 3A. After patterning the film 11, the substrate 1 masked by the patterned film 11 and etched by, for example, 10 to 100 micrometers to form the trench 2, as shown in FIG. 3B. Dry etching or wet etching may be used to form the trench 2.

Figure 3C:
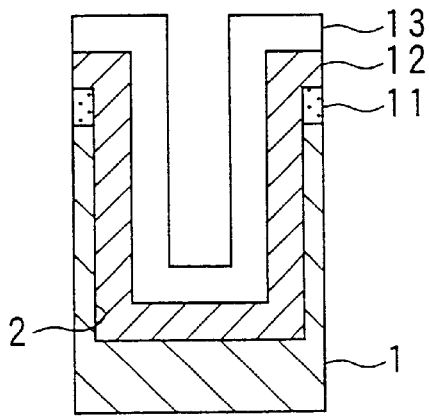
Figure 3D:
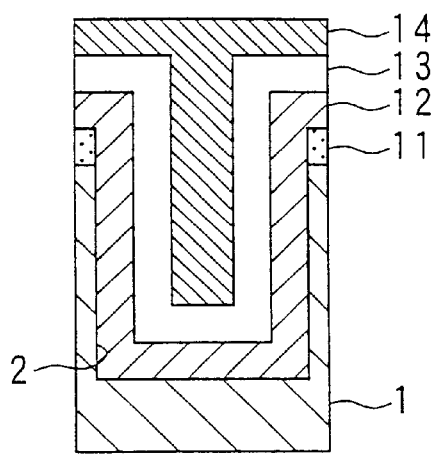

A p-type film 12 for the p-type base region 3 is deposited on the wall defining the trench 2. The film 12 is formed by epitaxial growth, so the p-type base region 3 has a substantially uniform thickness and a substantially homogeneous impurity concentration distribution. An n$^-$-type film 13 for the n$^-$-type drift region 4 is deposited to cover the film 12, as shown in FIG. 3C. The film 13 is also formed by epitaxial growth, so the n⁻-type drift region 4 has a substantially uniform thickness and a substantially homogeneous impurity concentration distribution. An n⁺-type film 14 for the n⁺-type drain region 5 is deposited to cover the film 13 and fill the trench 2, as shown in FIG. 3D. The film 14 is also formed by epitaxial growth, so the n⁺-type drain region 5 has a substantially uniform thickness and a substantially homogeneous impurity concentration distribution.

Figure 3E:
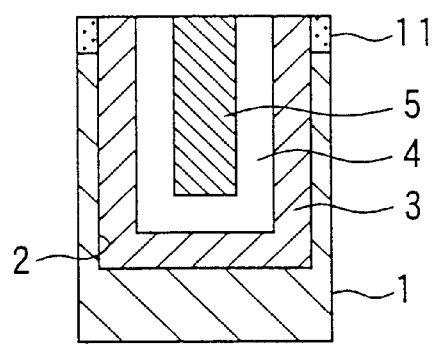

Afterward, the substrate 1 is polished from the top surface 1a to remove the three film layers 12, 13, and 14 above the level of the silicon oxide film 11 and to form the base region 3, the drift region 4, and drain region 5, as shown in FIG. 3E. The base region 3, the drift region 4, and drain region 5 are layered in the trench 2 on the basis of the thicknesses of the three films 12, 13, and 14. Although not illustrated, the power MOSFET is completed by the following processes. A plurality of trenches 6 are formed by selectively etching the substrate 1 from the top surface 1a. The gate oxide film 7 is formed on the surface that defines each trench 6. Then, each trench 6 is filled with n⁺-type polycrystalline silicon to form the gate electrode 8. The drain electrode, which is connected to the n⁺-type drain region 5, is formed on the top surface 1a. A source electrode, which is connected to the n⁺-type source region, is formed on the back surface 1b. Subsequently, a wiring is formed to connect the gate electrodes 8 to an external terminal. Finally, the top surface 1a is coated with a passivation film.

In this fabrication process, a void can be formed in the drain region 5 when each trench 2 is filled with the film 14 because the surface of the film 14 grows inwardly from the surface of the film 13 to join in the trench 2. However, each gate electrode 8 is formed to extend from the n⁺-type source region to the drift region 4 and to pass through the base region 3 without intersecting the drain region 5. This prevents the breakdown voltage from being reduced by a crystalline defect or a void.

Second Embodiment

Figure 4:
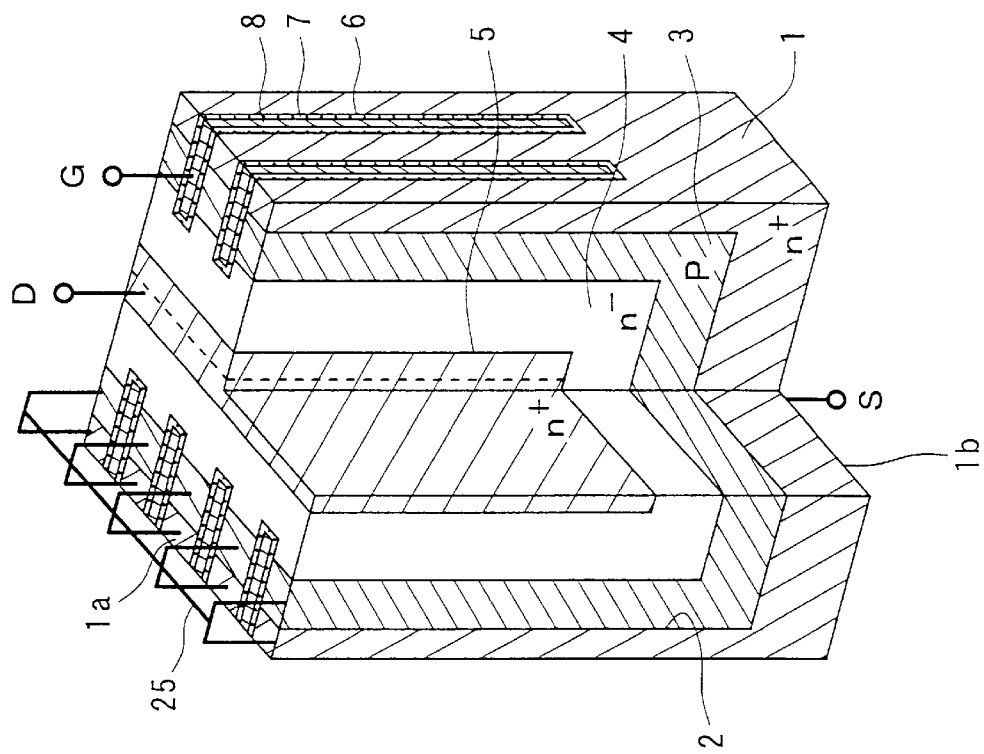
FIG. 4 is a perspective cross-sectional view of a power MOSFET according to the second embodiment of the present invention.
Figure 5:
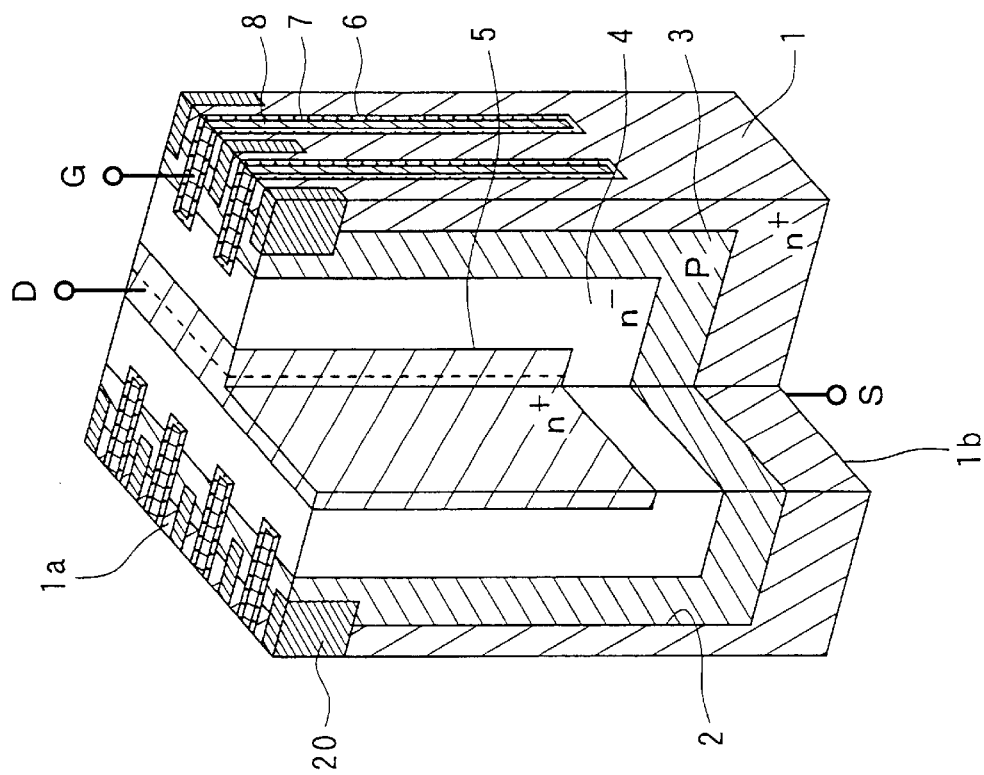
FIG. 5 is a perspective cross sectional view of the device in FIG. 1 showing wiring interconnecting regions of the power MOSFET.

As shown in FIG. 4, a power MOSFET according to a second embodiment includes an embedded metal layer 20, which electrically connects the n⁺-type source region 1 and the p-type base region 3 to apply the same potential to the n⁺-type source region 1 and the p-type base region 3. In the power MOSFET according to the first embodiment, the n⁺-type source region 1 and the p-type base region 3 are electrically connected using a metal wiring 25, as shown in FIG. 5. To connect the n⁺-type source region 1 and the p-type base region 3, a plurality of contact holes are formed in the interlayer insulating film and the metal wiring 25 is located in the contact hole. Therefore, the layout of the drain electrode is limited by the wiring 25. However, according to the second embodiment, this limitation is avoided by forming the metal layer 20.

Third Embodiment

Figure 6:
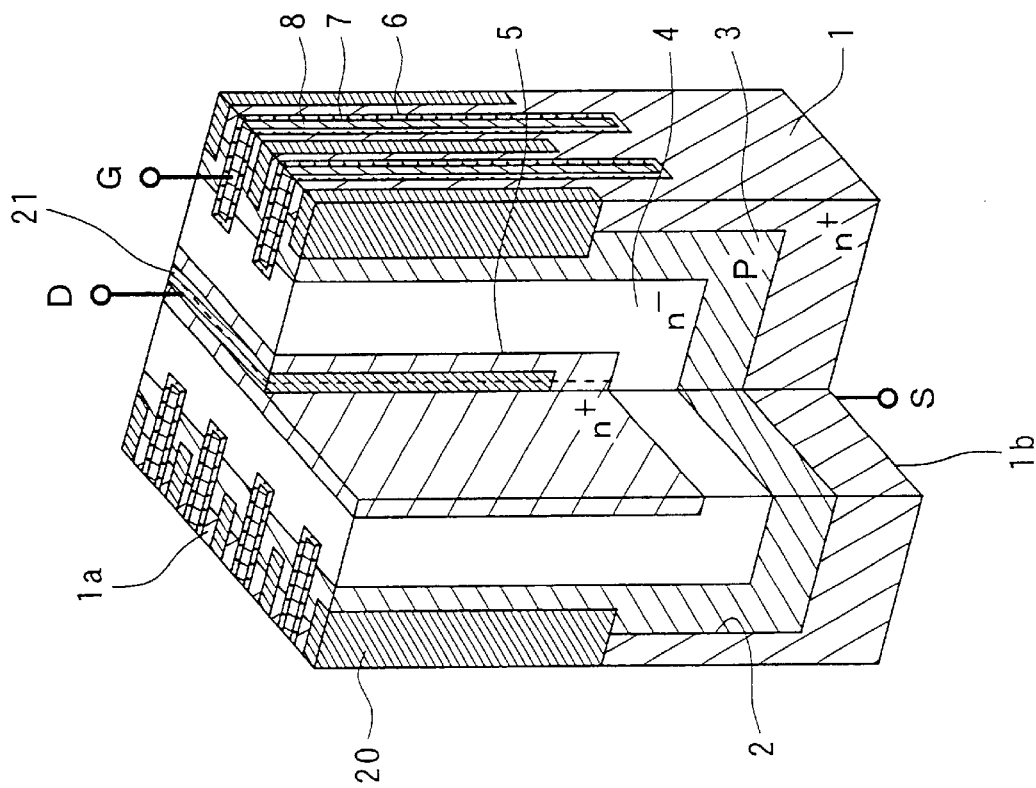
FIG. 6 is a perspective cross-sectional view of a power MOSFET according to the third embodiment of the present invention.

As shown in FIG. 6, a power MOSFET according to a third embodiment includes a first embedded metal layer 20, the depth of which is close to that of the drain region 5, and a second embedded metal layer 21 located in the drain region 5. The depth of the second embedded metal layer 21 is close to that of the first embedded metal layer 20. With this structure, the resistances of the n⁺-type source region 1 and the drain region 5 are reduced. The power MOSFET in this embodiment is manufactured by forming a plurality of trenches extending from the top surface 1a at a boundary between the n⁺-type source region 1 and the p-type base region 3 and in the region 5 after the process shown in FIG. 3E. Then, the trenches are filled with the metal layers 20 and 21.

Fourth Embodiment

Figure 7:
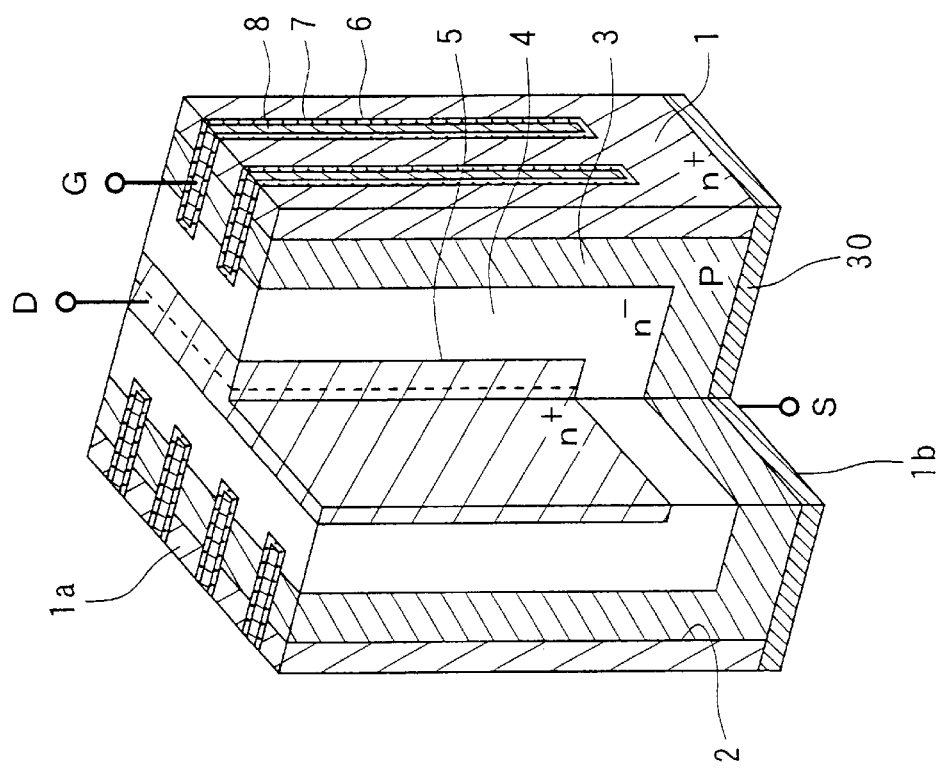
FIG. 7 is a perspective cross-sectional view of a power MOSFET according to the fourth embodiment of the present invention.

As shown in FIG. 7, a power MOSFET according to a fourth embodiment has a metal film 30, which electrically connects the n⁺-type source region 1 and the p-type base region 3, covering the back surface 1b. The power MOSFET of this embodiment is manufactured by polishing the back surface 1b until the base region 3 emerges and then depositing the metal film 30 on the back surface 1b. This structure produces the advantages and effects of the second embodiment. In addition, the resistance of the substrate 1 is decreased due to its reduced thickness.

Fifth Embodiment

Figure 8:
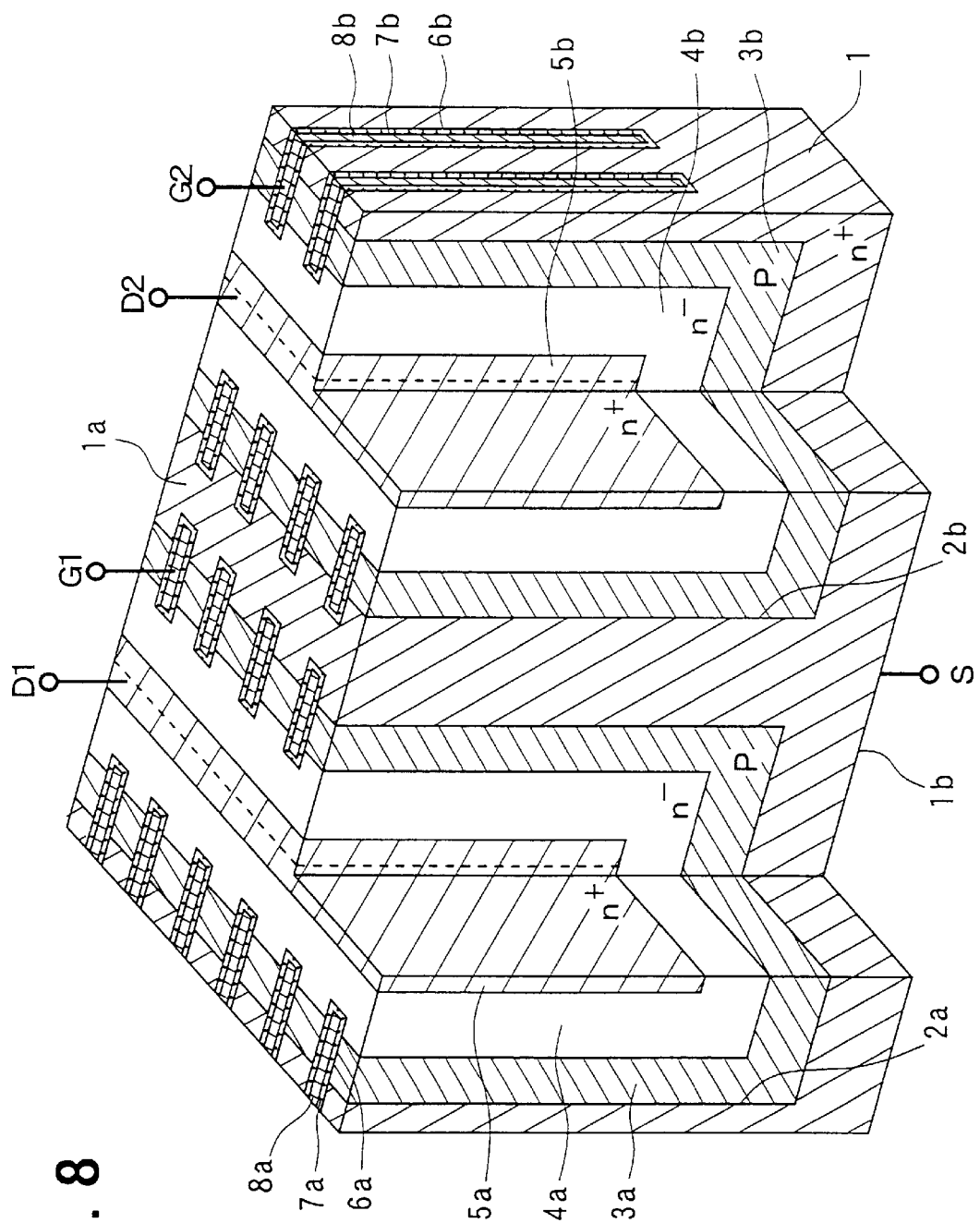
FIG. 8 is a perspective cross-sectional view of a power MOSFET according to the fifth embodiment of the present invention.
Figure 9:
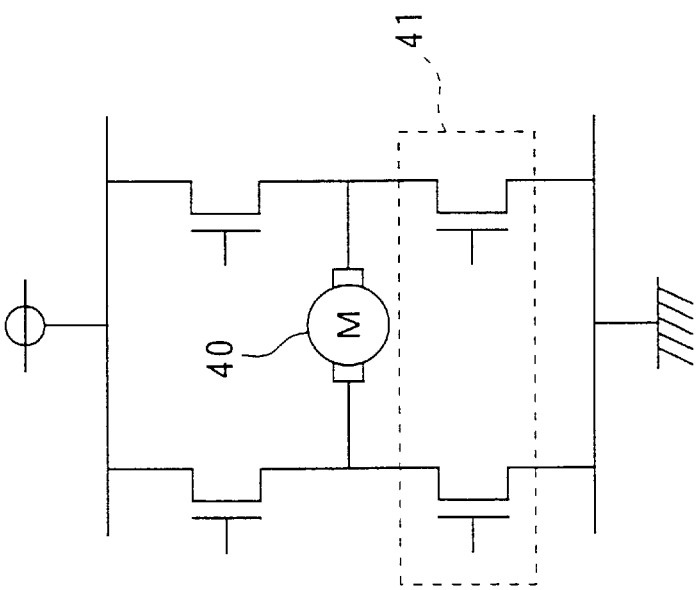
FIG. 9 is a circuit diagram in which the power MOSFET shown in FIG. 8 is used.

The power MOSFET devices of the first four embodiments each have a single cell in a single chip. However, a power MOSFET according to a fifth embodiment has a plurality of cells in a single chip. The cells are integrated into one element or a plurality of elements. For example, the power MOSFET shown in FIG. 8 has two elements, each of which has two cells. In FIG. 8, two cells share the n⁺-type source region. The substrate 1 has a pair of trenches 2a and 2b. The trenches 2a and 2b are respectively filled with p-type base regions 3a and 3b, n⁻-type drift regions 4a and 4b, and n⁺-type drain regions 5a and 5b. Gate insulating films 7a and 7b are respectively formed on sidewalls defining trenches 6a and 6b. Gate electrodes 8a and 8b are respectively embedded in the trenches 6a and 6b. The power MOSFET shown in FIG. 8 is usable, for example, to form a pair of lower side switches 41 in an H-bridge circuit for driving a motor 40, as shown in FIG. 9.

Sixth Embodiment

Figure 10:
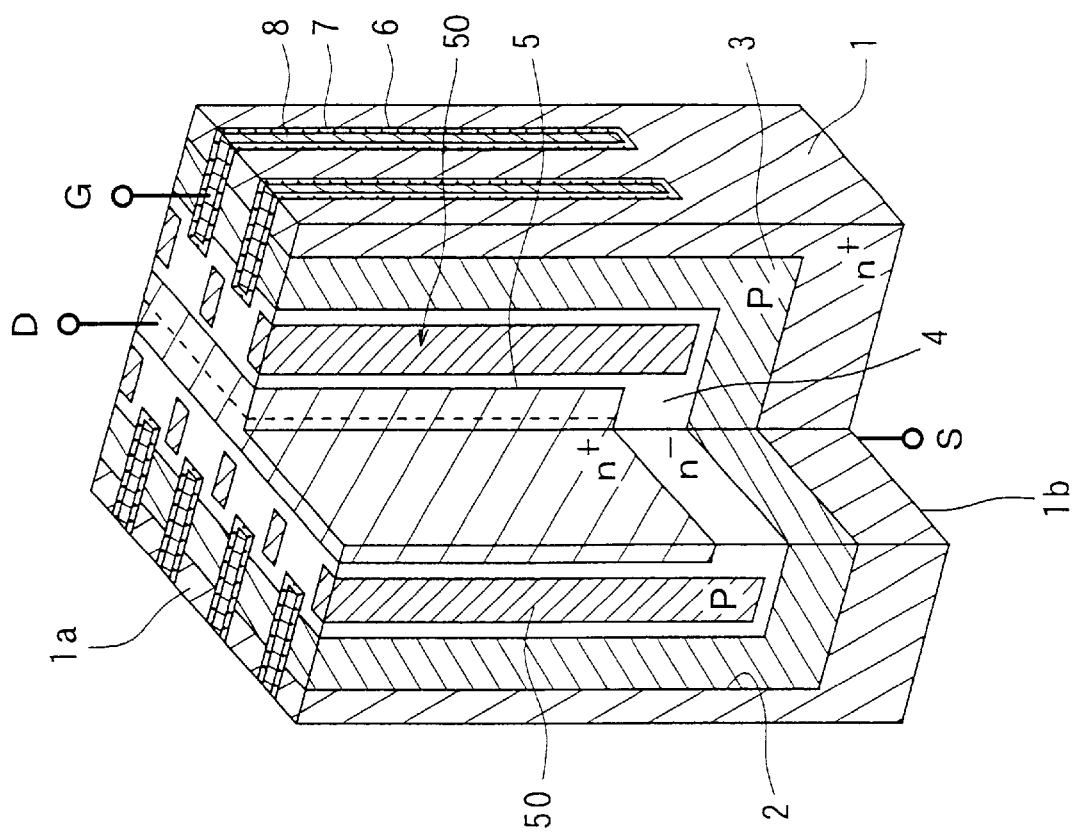
FIG. 10 is a perspective cross-sectional view of a power MOSFET according to the sixth embodiment of the present invention.

A power MOSFET according to a sixth embodiment is embedded with a p-type (second conduction type) RESURF layer 50 to increase the breakdown voltage. The RESURF layers 50 extend from the top surface 1a toward the back surface 1b in the n⁻-type drift region 4. The power MOSFET in FIG. 10 has a plurality of RESURF layers 50 located in a row at regular intervals as shown. The width and the impurity concentration of the RESURF layers 50 are determined to deplete completely the region 4 with depletion layers extending outwardly from the RESURF layers 50 when the power MOSFET is switched off. The breakdown voltage of the MOSFET is increased by the depletion layers. The power MOSFET in this embodiment is manufactured by forming a plurality of trenches extending from the top surface 1a in the n⁻-type drift region 4 after the process shown in FIG. 3E and then filling the trenches with the RESURF layers 50. The RESURF layers 50 shown in FIG. 10 are formed to avoid contacting the p-type base region 3 and the n⁺-type drain region 5. However, the RESURF layers 50 may contact the base region 3 and the drain region 5, as shown in FIGS. 11 and 12.

Figure 13:
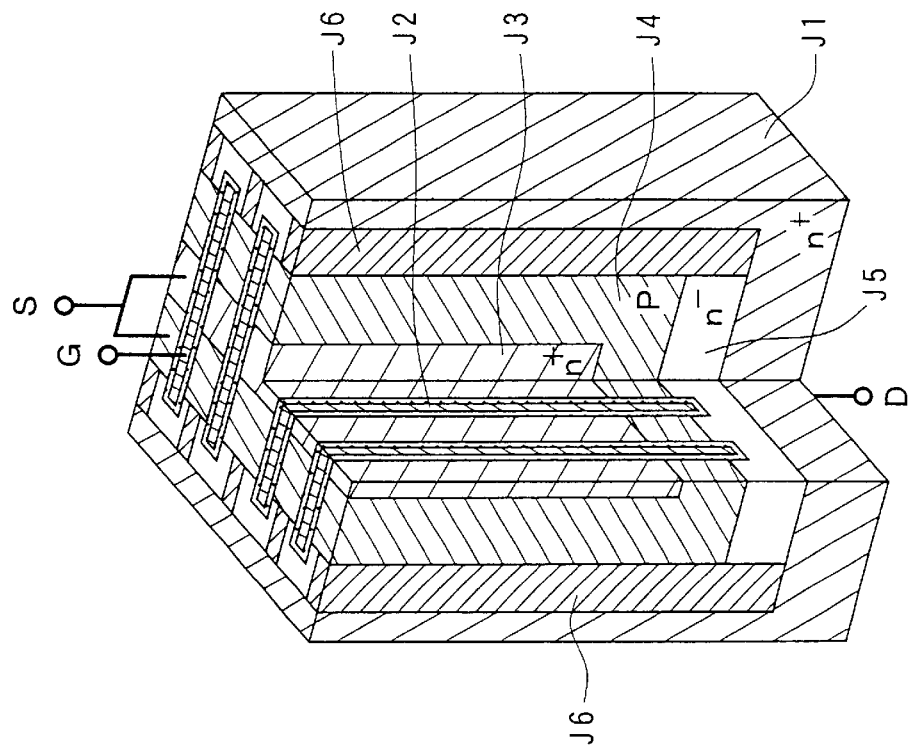
FIG. 13 is a perspective cross-sectional view of a power MOSFET in which a RESURF region is combined with a power MOSFET that was previously proposed by the present inventor.
Figure 14:
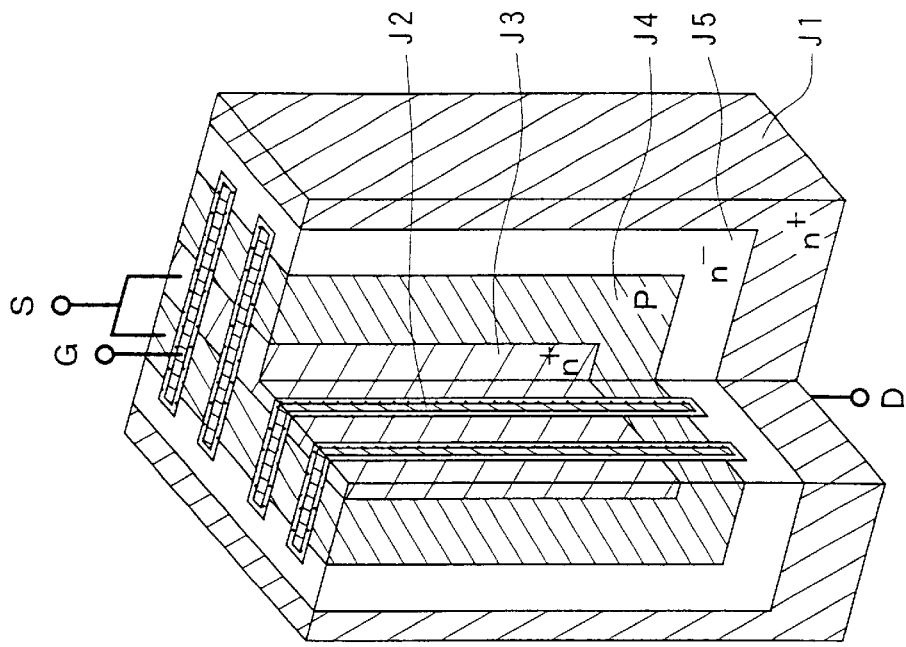
FIG. 14 is a perspective cross-sectional view of the power MOSFET previously proposed by the inventor.
Figure 16A:
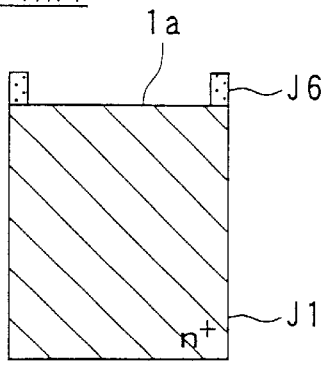
FIGS. 16A to 16E are cross-sectional views of the power MOSFET in FIG. 14 showing the fabrication steps, respectively, in order of their performance.
Figure 16B:
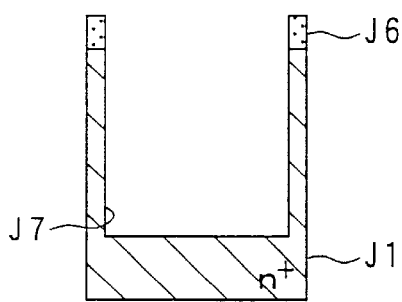
Figure 16C:
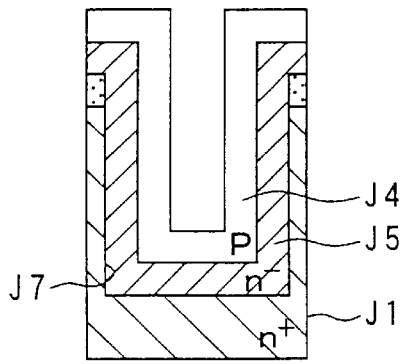
Figure 16D:
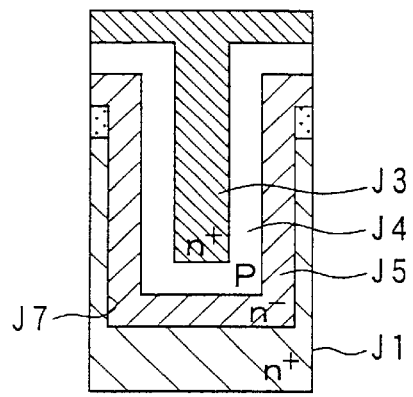
Figure 16E:
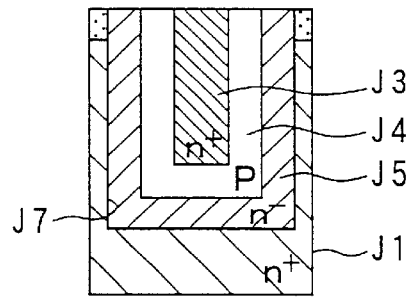
Figure 18:
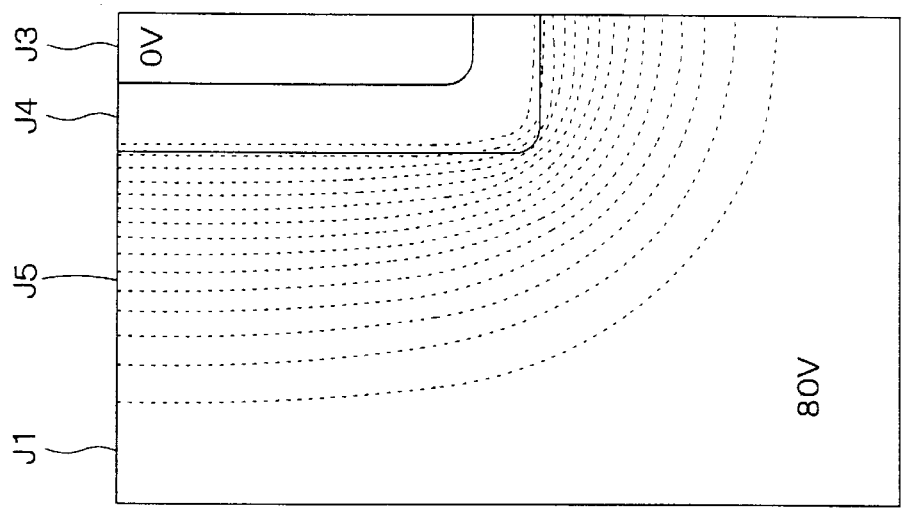
FIG. 18 is a cross-sectional diagram of the power MOSFET previously proposed by the inventor showing a simulated electric field distribution.
Figure 17:
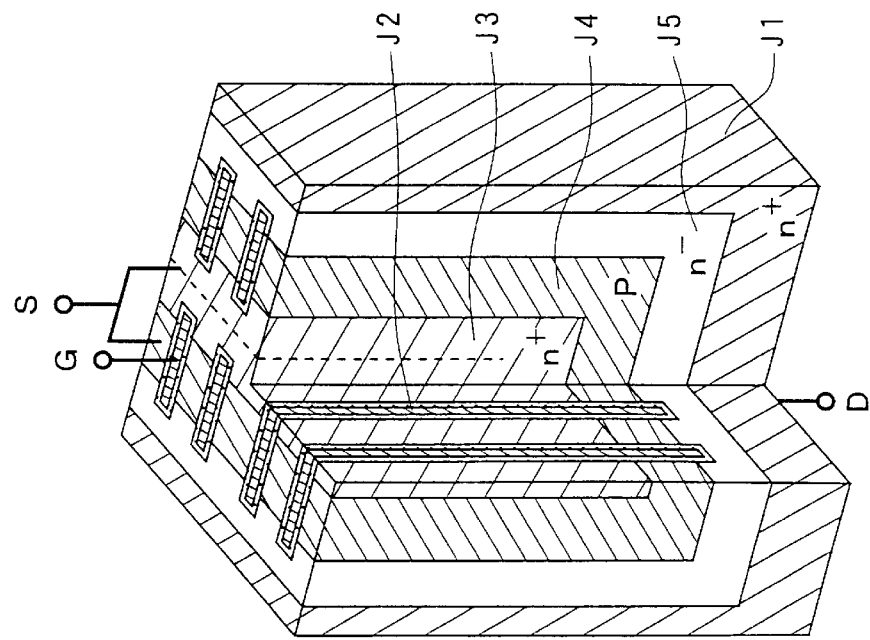
FIG. 17 is a perspective cross-sectional view of a proposed power MOSFET in which gate electrodes are formed to avoid crystalline defects and voids.

The RESURF layers 50 (J6) may be used in the power MOSFET shown in FIG. 14, which was previously proposed by the inventor of the present invention. However, in that case, a plurality of RESURF layers J6 are formed in the n⁻-type drift region J5 in two rows, as shown in FIG. 13, so the distance between the two rows of the RESURF layers J6, which are separated by n⁺-type source region J3 and the p-type base region J4, is so large that the RESURF layers J6 cannot completely deplete the bottom area of the region J5, and the electric field is concentrated at the bottom area. In contrast, the distance between the rows in the power MOSFET of FIG. 12 is small enough to deplete completely the bottom area of the drift region 4. Therefore, the RESURF layers J6 do not increase the breakdown voltage in the power MOSFET shown in FIG. 13 as effectively as the RESURF layers 50 in the embodiment of FIG. 12.

Figures 11, 12:
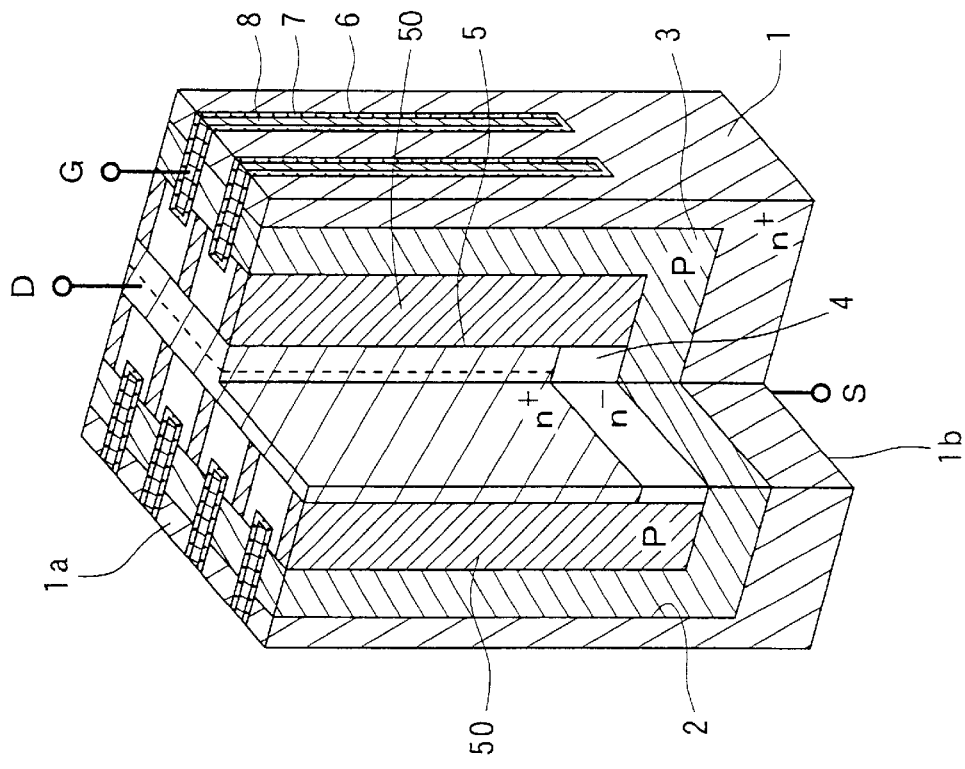
FIG. 11 is a perspective cross-sectional view of power MOSFET according to a modification of the sixth embodiment.
FIG. 12 is a perspective cross-sectional view of a power MOSFET according to another modification of the sixth embodiment.

In the power MOSFET devices of FIGS. 10–12, although the breakdown voltage would be worsened by increasing the impurity concentration of the n⁻-type drift region 4, the ON resistance would be decreased. Therefore, the power MOSFET devices of FIGS. 10–12 have a lower ON resistance than the device shown in FIG. 13 when the breakdown voltage of the power MOSFET in FIG. 13 is adjusted to that of the one shown in FIG. 13 by increasing the impurity concentration.

Further Modifications

In the illustrated embodiments, the present invention is applied to n-channel power MOSFET devices. However, the present invention is also applicable to a p-channel power MOSFET, in which each region is the opposite conduction type from that shown. In addition, the present invention is also applicable to an IGBT or a thyristor, in which the n⁺-type drain region 5 is replaced with a p⁺-type region. In this case, as a matter of course, each region can be the opposite conduction type.

What is claimed is:

1. A semiconductor device comprising:
   a semiconductor substrate having a top surface and a back surface, wherein the back surface is opposite to the top surface;
   a source region of a first conduction type, which extends in the substrate perpendicularly from the top surface;
   a base region of a second conduction type, which extends perpendicularly from the top surface, wherein the base region has a first surface and a second surface, the second surface being opposite to the first surface, wherein the first surface of the base region contacts the source region;
   a drift region of the first conduction type, wherein the drift region has an impurity concentration lower than that of the source region and extends perpendicularly from the top surface and contacts the second surface of the base region;
   a drain region extending perpendicularly from the top surface in the drift region;
   a gate insulating film formed on a surface that defines a trench, wherein the gate insulating film extends perpendicularly from the top surface and extends in a lateral direction from the source region to the drift region through the base region; and
   a gate electrode formed on a surface of the gate insulating film such that, when a voltage is applied to the gate electrode, a channel region is generated in the vicinity of a surface of the base region adjacent to the trench, wherein the flow of the channel occurs in the lateral direction.

2. The semiconductor device of claim 1, wherein the drain region is an epitaxially grown layer of the first conduction type in which two opposed parts of the grown layer have met one another.

3. The semiconductor device of claim 1, wherein the drain region, the drift region, and the base region have substantially homogeneous impurity concentrations in the perpendicular and the lateral directions.

4. The semiconductor device of claim 1 further comprising a metal layer, which is embedded at a boundary between the source region and the base region to electrically connect the source region and the base region.

5. The semiconductor device of claim 1 further comprising:
   a first metal layer extending perpendicularly from the top surface to approximately the depth of the drain region at a boundary between the source region and the base region to electrically connect the source region and the base region; and
   a second metal layer extending perpendicularly in the drain region from the top surface to approximately the depth of the drain region.

6. The semiconductor device of claim 1 further comprising a metal film formed on the back surface to electrically connect the source region and the base region.

7. The semiconductor device of claim 1, wherein the base region, the drift region, the drain region, the gate insulating film, and the gate electrode are parts of a cell, and the cell is one of a plurality of similar cells, and a drain electrode is connected to the drain region of each cell to form a plurality of transistors in a chip.

8. A semiconductor device comprising:
   a semiconductor substrate having a top surface and a back surface, wherein the back surface is opposite to the top surface;
   a source region of a first conduction type, which extends in the substrate perpendicularly from the top surface;
   a base region of a second conduction type, which extends perpendicularly from the top surface, wherein the base region has a first surface and a second surface, the second surface being opposite to the first surface, wherein the first surface of the base region contacts the source region;
   a drift region of the first conduction type, wherein the drift region has an impurity concentration lower than that of the source region and extends perpendicularly from the top surface and contacts the second surface of the base region;
   a drain region extending perpendicularly from the top surface in the drift region;
   a gate insulating film formed on a surface that defines a trench, wherein the gate insulating film extends perpendicularly from the top surface and extends in a lateral direction from the source region to the drift region through the base region;
   a gate electrode formed on a surface of the gate insulating film; and
   at least one RESURF layer of the second conduction type, wherein the RESURF layer extends perpendicularly from the top surface in the drift region such that, when a voltage is applied to the gate electrode, a channel region is generated in the vicinity of a surface of the base region adjacent to the trench, wherein the flow of the channel occurs in the lateral direction.

9. The semiconductor device of claim 8, wherein the drain region, the drift region, the base region, and the RESURF layer have homogeneous impurity concentrations in the perpendicular and the lateral directions.

10. The semiconductor device of claim 8, wherein the RESURF layer is one of a plurality of RESURF layers, which are formed to completely deplete the drift region with depletion layers formed respectively about the RESURF layers when the voltage is not applied to the gate electrode.

11. The semiconductor device of claim 8, wherein the RESURF layer contacts the base region.

* * * * *